(12) United States Patent
Shiota

(10) Patent No.: US 11,581,463 B2
(45) Date of Patent: *Feb. 14, 2023

(54) PACKAGE

(71) Applicant: NICHIA CORPORATION, Anan (JP)

(72) Inventor: Yuki Shiota, Tokushima (JP)

(73) Assignee: NICHIA CORPORATION, Anan (JP)

( * ) Notice: Subject to any disclaimer, the term of this patent is extended or adjusted under 35 U.S.C. 154(b) by 75 days.

This patent is subject to a terminal disclaimer.

(21) Appl. No.: 17/147,455

(22) Filed: Jan. 13, 2021

(65) Prior Publication Data

US 2021/0135075 A1 May 6, 2021

Related U.S. Application Data

(63) Continuation of application No. 16/449,445, filed on Jun. 24, 2019, now Pat. No. 10,923,643.

(30) Foreign Application Priority Data

Jun. 25, 2018 (JP) .............................. JP2018-120209

(51) Int. Cl.
*H01L 33/62* (2010.01)
*H01L 33/50* (2010.01)
(Continued)

(52) U.S. Cl.
CPC ............ *H01L 33/62* (2013.01); *H01L 33/507* (2013.01); *H01L 33/60* (2013.01); *H01L 33/641* (2013.01)

(58) Field of Classification Search
CPC ....... H01L 33/62; H01L 33/507; H01L 33/60; H01L 33/641; H01L 33/644;
(Continued)

(56) References Cited

U.S. PATENT DOCUMENTS 10,923,643 B2 * 2/2021 Shiota .................... H01L 33/62
2004/0000702 A1 1/2004 Knapp et al.
(Continued)

FOREIGN PATENT DOCUMENTS

JP 05-315536 11/1993
JP 06-326227 11/1994
(Continued)

OTHER PUBLICATIONS

Office Action with Form PTO-892 Notice of References Cited issued by the U.S. Patent and Trademark Office for the parent U.S. Appl. No. 16/449,445, filed Jul. 9, 2020.
(Continued)

*Primary Examiner* — Tong-Ho Kim
(74) *Attorney, Agent, or Firm* — Mori & Ward, LLP

(57) ABSTRACT

A package includes a first lead including a first electrode terminal, a second lead including a second electrode terminal, a first molded body holding the first lead, and a second molded body holding the second lead. The second lead is provided on the first lead in an overlapping direction such that the first electrode terminal of the first lead overlaps with the second electrode terminal of the second lead when viewed in the overlapping direction. The first electrode terminal and the second electrode terminal are electrically connected to each other without adding additional material. A part of the first molded body and a part of the second molded body are in contact with each other.

20 Claims, 13 Drawing Sheets

(51) Int. Cl.
*H01L 33/64* (2010.01)
*H01L 33/60* (2010.01)

(58) Field of Classification Search
CPC ............ H01L 2933/0066; H01L 33/54; H01L 33/647; H01L 2933/005
USPC ......................................................... 257/82
See application file for complete search history.

(56) References Cited

U.S. PATENT DOCUMENTS

| | | |
|---|---|---|
| 2004/0014257 A1 | 1/2004 | Kim et al. |
| 2013/0113015 A1* | 5/2013 | Kimura ................. H01L 33/642 438/22 |
| 2013/0221509 A1 | 8/2013 | Oda et al. |
| 2014/0349424 A1 | 11/2014 | Oda et al. |
| 2015/0014717 A1 | 1/2015 | Park |
| 2015/0084177 A1 | 3/2015 | Oda et al. |
| 2015/0155435 A1 | 6/2015 | Nei |
| 2015/0349227 A1 | 12/2015 | Oda et al. |
| 2015/0372210 A1 | 12/2015 | Oda et al. |
| 2016/0079504 A1 | 3/2016 | Oda et al. |
| 2016/0293817 A1 | 10/2016 | Oda et al. |
| 2017/0092830 A1 | 3/2017 | Oda et al. |
| 2018/0287026 A1 | 10/2018 | Richter |

FOREIGN PATENT DOCUMENTS

| | | |
|---|---|---|
| JP | 2005-116937 | 4/2005 |
| JP | 2006-210594 | 8/2006 |
| JP | 2007-158208 | 6/2007 |
| JP | 2013-058574 | 3/2013 |
| JP | 2013-101996 | 5/2013 |
| WO | WO 2012/060336 | 5/2012 |
| WO | WO 2017/060280 | 4/2017 |

OTHER PUBLICATIONS

Notice of Allowance issued by the United States Patent and Trademark Office for the parent U.S. Appl. No. 16/449,445, filed Oct. 14, 2020.

* cited by examiner

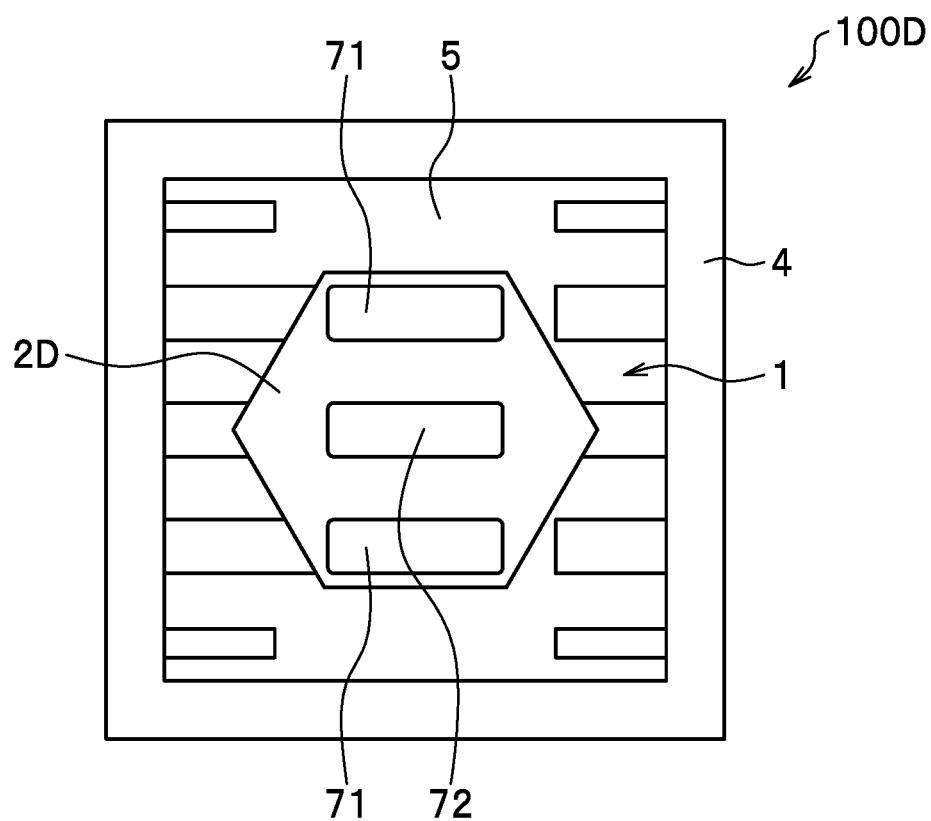

PACKAGE

CROSS-REFERENCE TO RELATED APPLICATIONS

The present application is a continuation application of the U.S. patent application Ser. No. 16/449,445, filed on Jun. 24, 2019, which claims priority under 35 U.S.C. § 119 to Japanese Patent Application No. 2018-120209, filed Jun. 25, 2018. The contents of these applications are incorporated herein by reference in their entirety.

BACKGROUND OF THE INVENTION

Field of the Invention

The present disclosure relates to a package.

Discussion of the Background

Various packages used in light emitting devices have been disclosed. For example, Japanese Unexamined Patent Application Publication No. 2013-101996 discloses a package obtained by stacking a first lead frame and a second lead frame that have different shape patterns.

SUMMARY OF THE INVENTION

According to one aspect of the present invention, a package includes a first lead including a first electrode terminal, a second lead including a second electrode terminal and provided on the first lead in an overlapping direction such that the first electrode terminal of the first lead overlaps with the second electrode terminal of the second lead when viewed in the overlapping direction, a first molded body holding the first lead, and a second molded body holding the second lead. The first electrode terminal and the second electrode terminal are electrically connected to each other without adding additional material. A part of the first molded body and a part of the second molded body are in contact with each other.

According to another aspect of the present invention, a package includes a first lead including a first electrode terminal, and a second lead including a second electrode terminal and provided on the first lead in an overlapping direction such that the first electrode terminal of the first lead overlaps with the second electrode terminal of the second lead when viewed in the overlapping direction. The first electrode terminal and the second electrode terminal are electrically connected to each other without adding additional material. The first lead includes an electrically independent terminal separate from the first electrode terminal. The second lead includes a terminal branched portion that is continuous with the second electrode terminal. The electrically independent terminal is spaced apart from and is perpendicular to the terminal branched portion when viewed in the overlapping direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 10 is a schematic plan view illustrating a configuration of a light emitting device according to another embodiment;

DESCRIPTION OF THE EMBODIMENTS

Figure 1A:
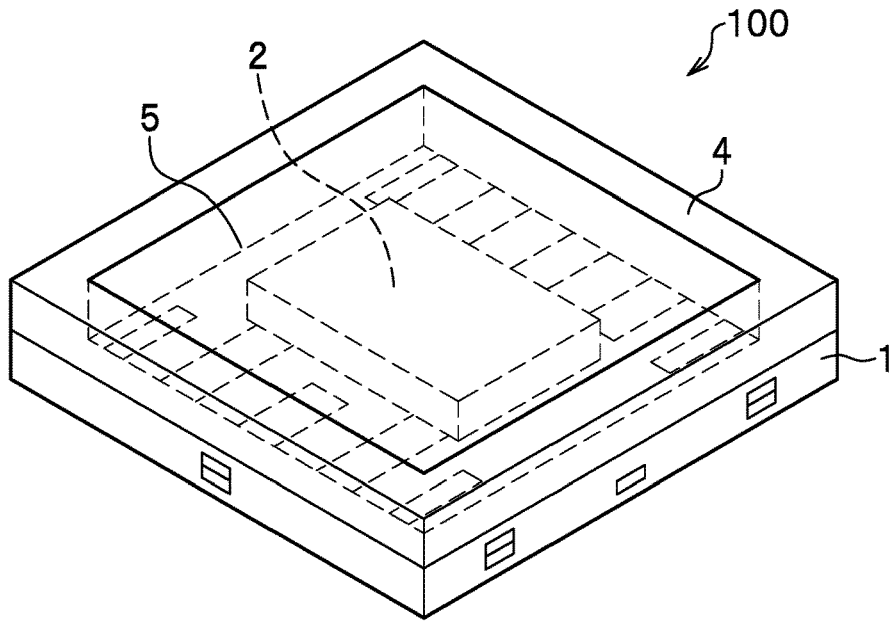
FIG. 1A is a schematic perspective view illustrating a configuration of a package and a light emitting device according to a first embodiment.

The embodiments will now be described with reference to the accompanying drawings, wherein like reference numerals designate corresponding or identical elements throughout the various drawings.

Embodiments are described below with reference to drawings. The aspects described below, however, only exemplify a package, a light emitting device, and methods of manufacturing them to embody technical ideas of the present embodiments, and the present embodiments are not limited to these aspects. Further, the embodiments are not intended to limit the scope of the present invention only to, for example, the dimensions, the materials, and the shapes of constituent components, and the relative disposition among the constituent components described in the embodiments unless otherwise specified, and these details are no more than exemplification. The size, the positional relationship, and the like of members illustrated in the drawings are sometimes exaggerated for clear description.

First Embodiment

Figure 1B:
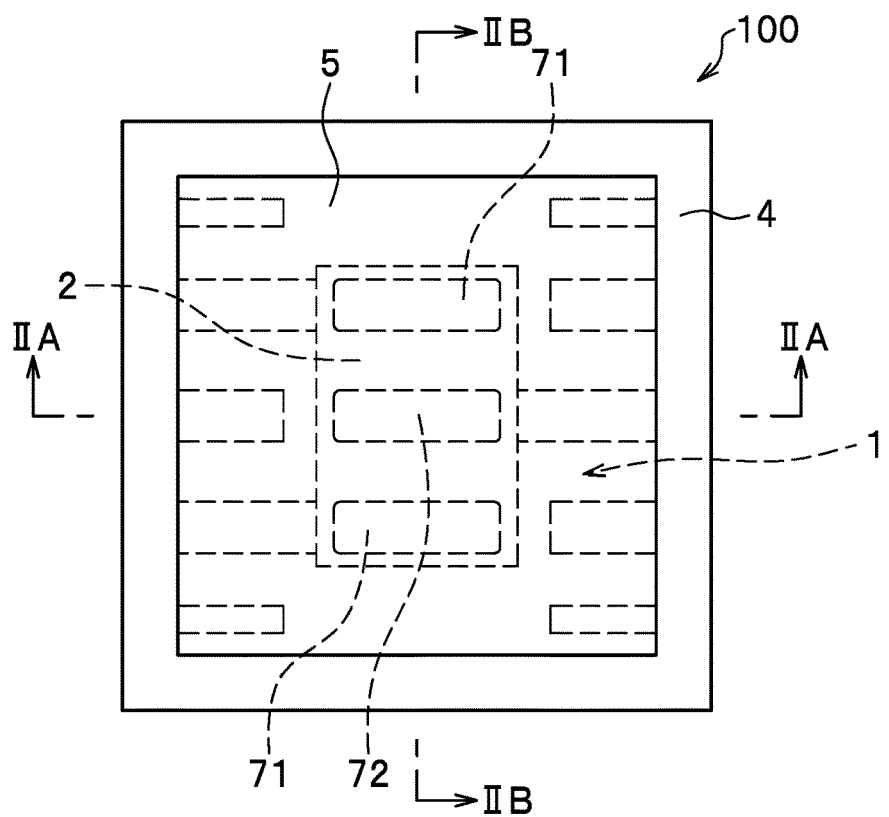
FIG. 1B is a schematic plan view illustrating the configuration of the package and the light emitting device according to the first embodiment.
Figure 2A:
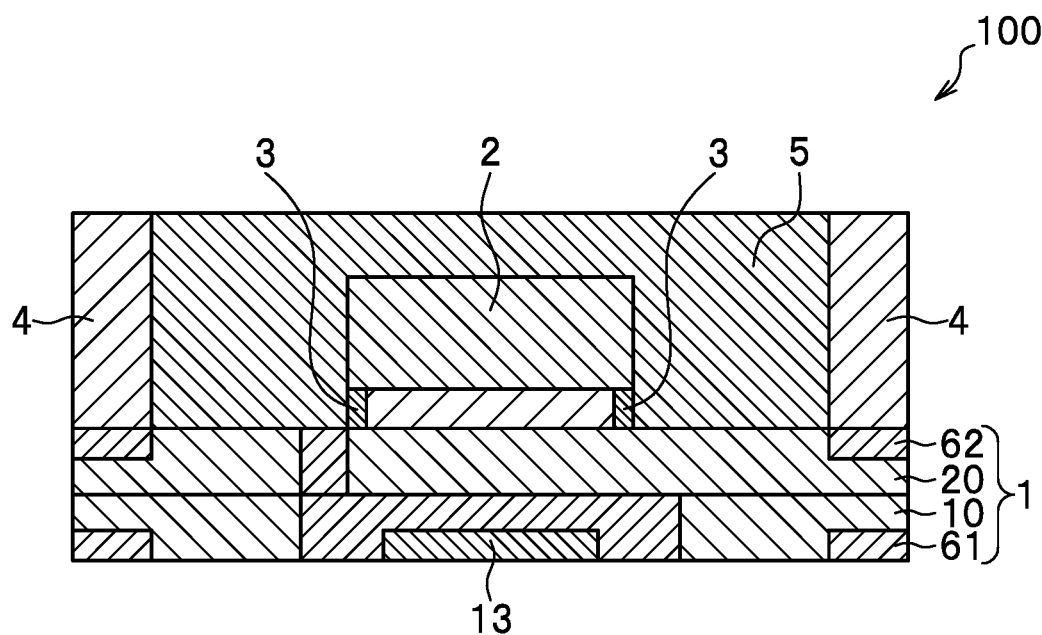
FIG. 2A is a schematic sectional view taken along the line IIA-IIA in FIG. 1B.
Figure 2B:
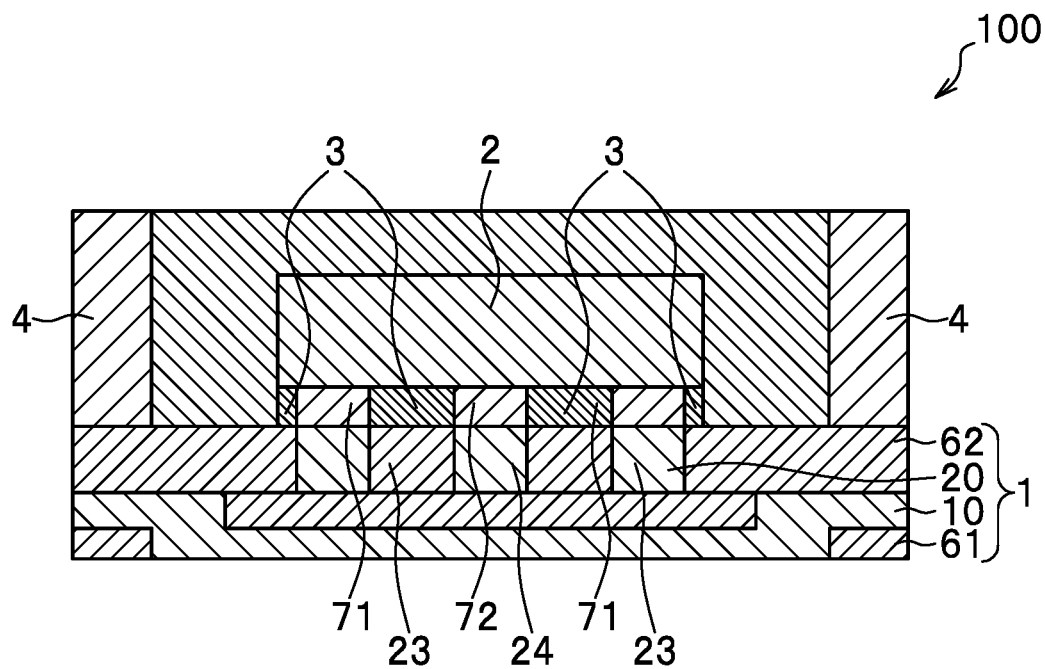
FIG. 2B is a schematic sectional view taken along the line IIB-IIB in FIG. 1B.
Figure 3A:
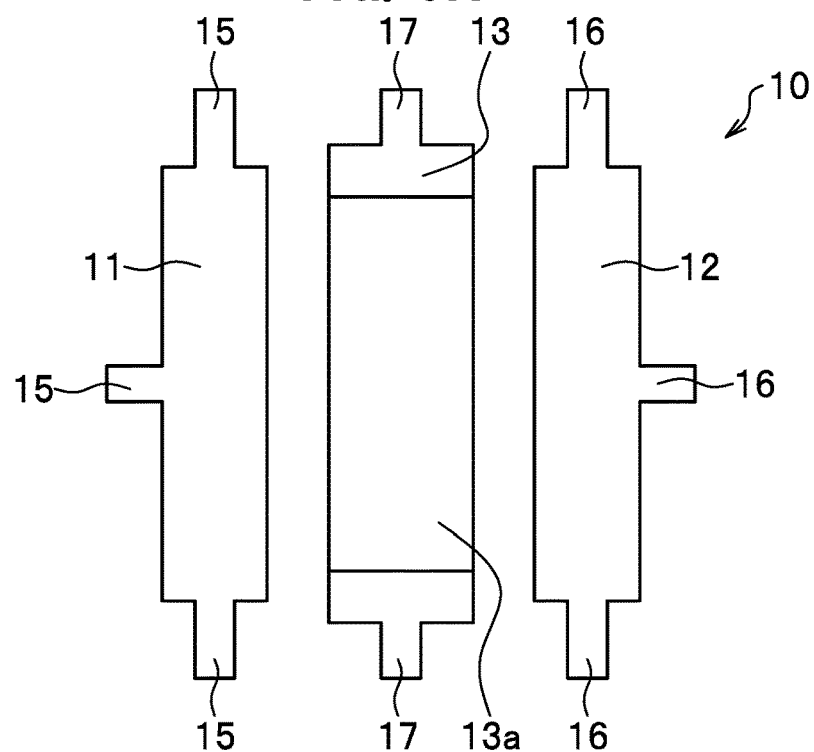
FIG. 3A is a schematic plan view illustrating a configuration of a first lead according to the first embodiment.
Figure 3B:
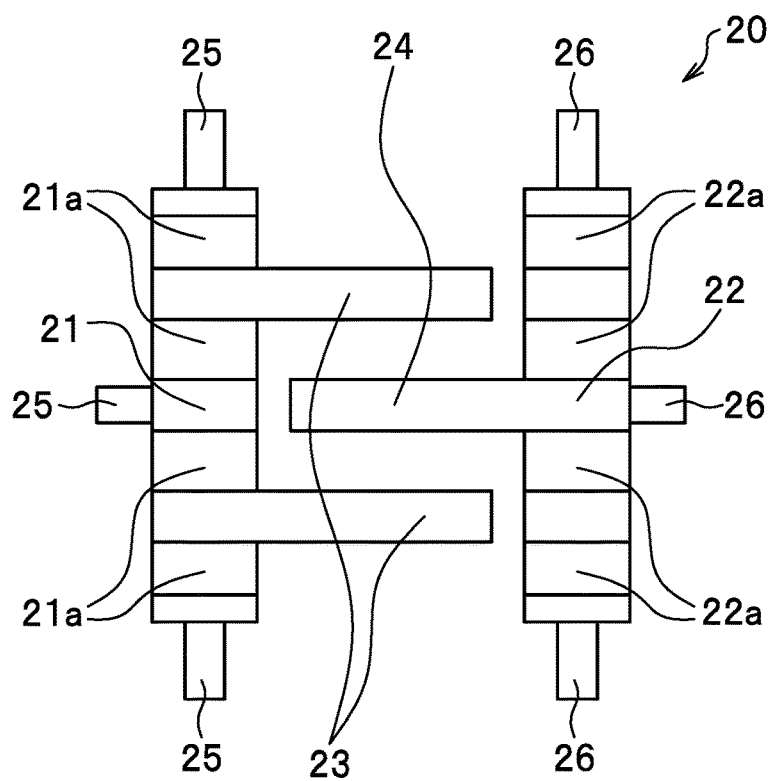
FIG. 3B is a schematic plan view illustrating a configuration of a second lead according to the first embodiment.
Figure 4A:
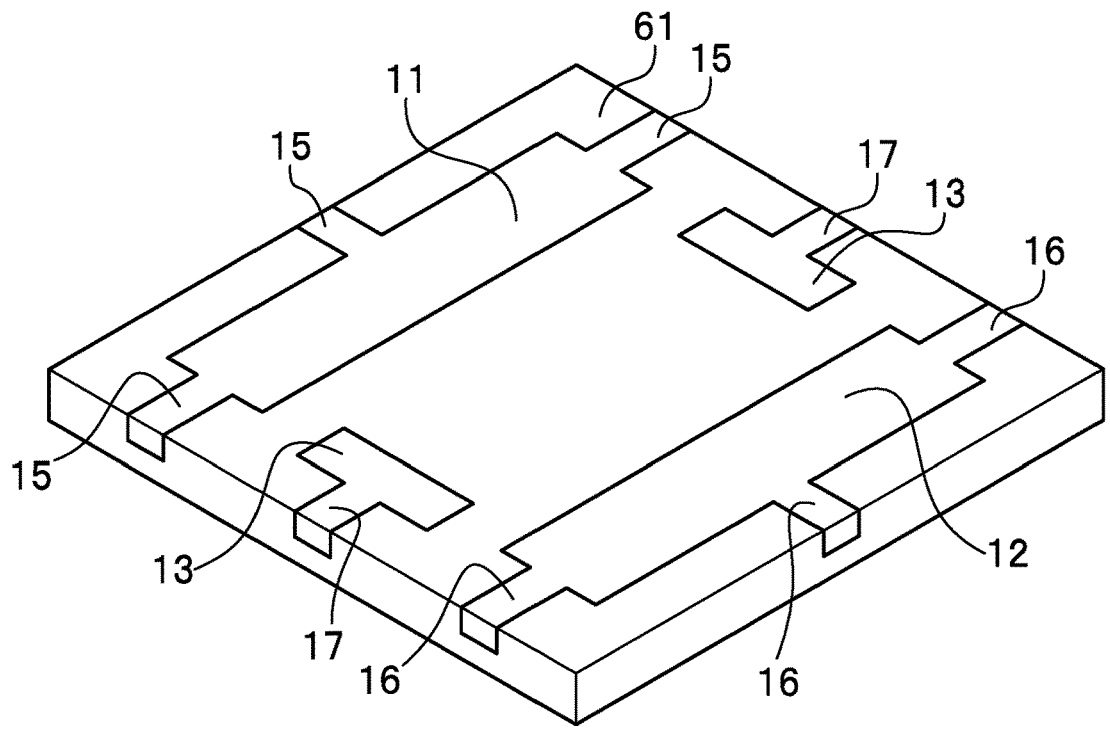
FIG. 4A is a schematic perspective view illustrating the configuration of the first lead according to the first embodiment that is provided with a first molded body.
Figure 4B:
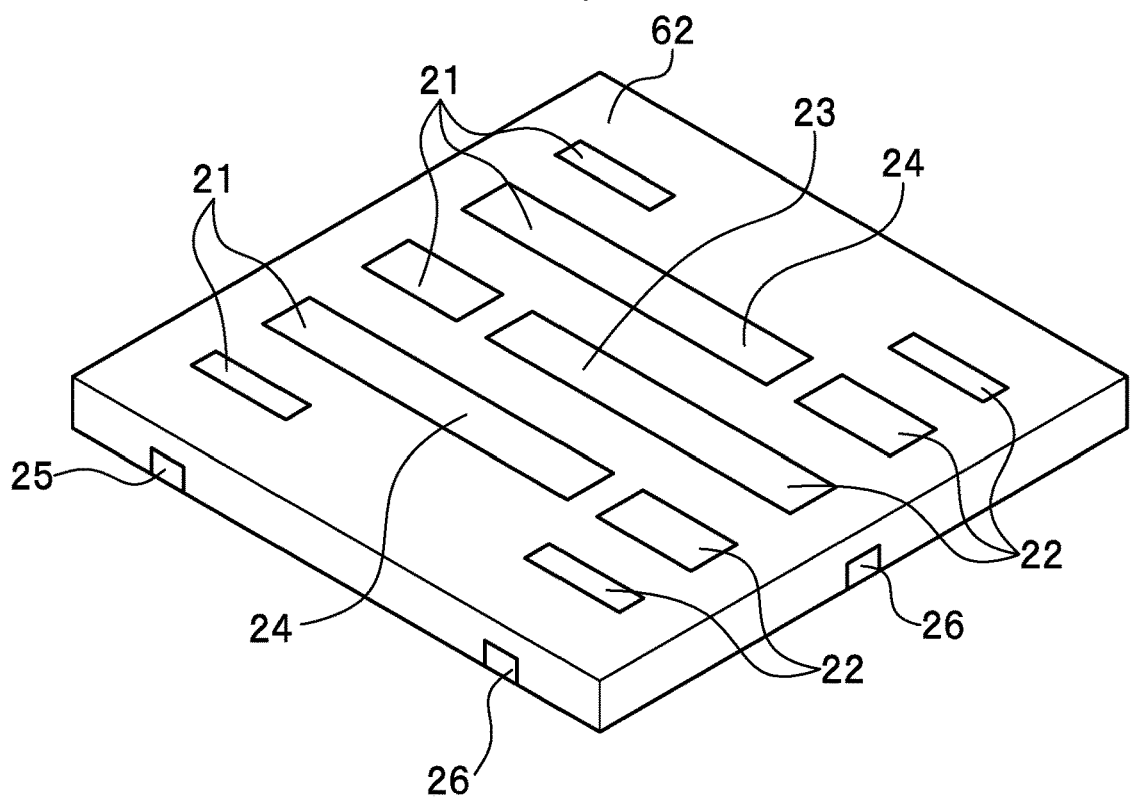
FIG. 4B is a schematic perspective view illustrating the configuration of the second lead according to the first embodiment that is provided with a second molded body.

FIG. 1A is a schematic perspective view illustrating a configuration of a package and a light emitting device according to a first embodiment. FIG. 1B is a schematic plan view illustrating the configuration of the package and the light emitting device according to the first embodiment. FIG. 2A is a schematic sectional view taken along the line IIA-IIA in FIG. 1B. FIG. 2B is a schematic sectional view taken along the line IIB-IIB in FIG. 1B. FIG. 3A is a schematic plan view illustrating a configuration of a first lead according to the first embodiment. FIG. 3B is a schematic plan view illustrating a configuration of a second lead according to the first embodiment. FIG. 4A is a schematic perspective view illustrating the configuration of the first lead according to the first embodiment that is provided with a first molded body. FIG. 4B is a schematic perspective view illustrating the configuration of the second lead according to the first embodiment that is provided with a second molded body.
Package A package 1 includes a first lead 10, a first molded body 61, a second lead 20, and a second molded body 62.

The first lead 10 forms a prescribed wiring pattern. The first lead 10 includes an N-side first portion (hereinafter, referred to as a first N-side electrode terminal for convenience) 11 as an N-side electrode terminal, a P-side first portion (hereinafter, referred to as a first P-side electrode terminal for convenience) 12 as a P-side electrode terminal, and a third portion 13 as a heat dissipation terminal, with the portions spaced apart from each other in parallel. The first lead 10 also includes holding portions 15, 16, and 17.

The first N-side electrode terminal 11 is a member bonded to and conductive with an N-side second portion (hereinafter, referred to as a second N-side electrode terminal for convenience) 21 as an N-side electrode terminal of the second lead 20. The first N-side electrode terminal 11 is positioned on the left side from the center of the first lead 10 in a planar view and is formed in a rectangular shape.

The first P-side electrode terminal 12 is a member bonded to and conductive with a P-side second portion (hereinafter, referred to as a second P-side electrode terminal for convenience) 22 as a P-side electrode terminal of the second lead 20. The first P-side electrode terminal 12 is positioned on the right side from the center of the first lead 10 in a planar view and is formed in a rectangular shape.

The first N-side electrode terminal 11 and the first P-side electrode terminal 12 each have both surfaces thereof exposed from the first molded body 61.

The heat dissipation terminal 13 is a member for promoting heat dissipation of a light emitting device 100. The heat dissipation terminal 13 is formed in a rectangular shape at a center portion of the first lead 10 in a planar view. The heat dissipation terminal 13 is disposed being spaced apart from the first N-side electrode terminal 11 and the first P-side electrode terminal 12 and is electrically independent from the first N-side electrode terminal 11 and the first P-side electrode terminal 12.

The heat dissipation terminal 13 has its front surface etched to about half of its thickness at a portion except an upper end and a lower end in a planar view (hereinafter, referred to as half-etching for convenience). The heat dissipation terminal 13 is half-etched to have a recess portion 13a. The recess portion 13a is a groove portion continuously formed between side surfaces of the heat dissipation terminal 13 along the heat dissipation terminal's plate width, and the first molded body 61 is provided in the recess portion 13a as the groove portion. The heat dissipation terminal 13 has both surfaces thereof exposed from the first molded body 61 except the recess portion 13a.

The holding portions 15, 16, and 17 connect a plurality of first leads 10. The holding portion 15 is formed continuously with the first N-side electrode terminal 11, the holding portion 16 is formed continuously with the first P-side electrode terminal 12, and the holding portion 17 is formed continuously with the heat dissipation terminal 13. These holding portions 15, 16, and 17 extend toward the exterior of the first lead 10 in a planar view. The holding portions 15, 16, and 17 have rear surfaces thereof half-etched and the first molded body 61 is provided in the half-etched portions. The holding portions 15, 16, and 17 have front surfaces thereof exposed from the first molded body 61.

Here, the holding portions 15, 16, and 17 are described as portions other than the first N-side electrode terminal 11, the first P-side electrode terminal 12, and the heat dissipation terminal 13, respectively. The holding portions 15, 16, and 17, however, may be included in the first N-side electrode terminal 11, the first P-side electrode terminal 12, and the heat dissipation terminal 13, respectively.

The second lead 20 is disposed on the first lead 10 and is face-to-face bonded to the first lead 10. The second lead 20 forms a wiring pattern different from the shape of the first lead 10. The second lead 20 includes the N-side second portion 21 as the second N-side electrode terminal, the P-side second portion 22 as the second P-side electrode terminal, an N-side fourth portion (hereinafter, referred to as an N-side terminal branched portion for convenience) 23 as an N-side terminal branched portion, a P-side fourth portion (hereinafter, referred to as a P-side terminal branched portion for convenience) 24 as a P-side terminal branched portion, and holding portions 25 and 26.

The second N-side electrode terminal 21 overlaps the first N-side electrode terminal 11 of the first lead 10 in a planar view. The second N-side electrode terminal 21 is half-etched to have four recess portions 21a on a surface opposite to a surface facing the first lead 10. Each of the recess portions 21a is a groove portion continuously formed between side surfaces of the second N-side electrode terminal 21 along the second N-side electrode terminal's plate width. The second lead 20 that has been bonded to the first lead 10 is filled, at the recess portions 21a as the groove portions, with a part of the second molded body 62 holding the second lead 20. This makes the first lead 10 more strongly bonded to the second lead 20. The second N-side electrode terminal 21 has both surfaces thereof exposed from the second molded body 62 except the recess portions 21a.

The second P-side electrode terminal 22 overlaps the first P-side electrode terminal 12 of the first lead 10 in a planar view. The second P-side electrode terminal 22 is half-etched to have four recess portions 22a on a surface opposite to a surface facing the first lead 10. Each of the recess portions 22a is a groove portion continuously formed between side surfaces of the second P-side electrode terminal 22 along the second P-side electrode terminal's plate width. The second lead 20 that has been bonded to the first lead 10 is filled, at the recess portions 22a as the groove portions, with a part of the second molded body 62 holding the second lead 20. This makes the first lead 10 more strongly bonded to the second lead 20. The second P-side electrode terminal 22 has both surfaces thereof exposed from the second molded body 62 except the recess portions 22a.

The first lead 10 and the second lead 20 are bonded to each other by direct bonding at the portion on the front surface of the first lead 10 that is exposed from the first molded body 61 and the portion on the rear surface of the second lead 20 that is exposed from the second molded body 62 in the first N-side electrode terminal 11 and the second N-side electrode terminal 21.

The first lead 10 and the second lead 20 are bonded to each other by direct bonding at the portion on the front surface of the first lead 10 that is exposed from the first molded body 61 and the portion on the rear surface of the second lead 20 that is exposed from the second molded body 62 in the first P-side electrode terminal 12 and the second P-side electrode terminal 22.

Here, the direct bonding means bonding without using another member such as an adhesive agent. The direct bonding is preferably diffusion bonding. The diffusion bonding is a "method of closely attaching base materials to each other and pressing them with a pressure causing as little plastic deformation as possible, under a temperature condition of melting temperatures or lower of the base materials, to bond the base materials to each other utilizing atom diffusion generated between the surfaces of the base materials to be bonded."

The direct bonding between the first N-side electrode terminal 11 and the second N-side electrode terminal 21 and between the first P-side electrode terminal 12 and the second P-side electrode terminal 22 requires no bonding member such as an adhesive agent or solder. Therefore, it is unnecessary to provide a groove portion or an opening portion to be filled with a bonding member on the leads, and the flexibility of designing increases. In addition, no provision of a bonding member improves the heat dissipation. In addition, no provision of a bonding member enables omission of a step of providing a bonding member to reduce costs. Further, the direct bonding gives an effect of, for example, preventing positional deviation during bonding of the first lead 10 to the second lead 20 and making it unnecessary to remove burr formed when a bonding member is protruded.

The N-side terminal branched portion 23 is a portion to which an N-side electrode 71 of a light emitting element 2 is bonded. The N-side terminal branched portion 23 is formed continuously with and perpendicularly to the second N-side electrode terminal 21 and extends toward the center of the second lead 20 in a planar view. The N-side terminal branched portion 23 is formed at a position that allows a portion thereof to overlap the heat dissipation terminal 13 of the first lead 10 in a planar view. The N-side terminal branched portion 23 allows the portion thereof to perpendicularly overlap the heat dissipation terminal 13 in a planar view. The heat dissipation terminal 13 of the first lead 10 has the recess portion 13a at the part that overlaps and faces the portion of the N-side terminal branched portion 23. Therefore, in the heat dissipation terminal 13 and the N-side terminal branched portion 23, the first lead 10 is spaced apart from the second lead 20 with the recess portion 13a interposed therebetween. The recess portion 13a between the heat dissipation terminal 13 and the N-side terminal branched portion 23 allows continuous filling with a part of the first molded body 61.

The P-side terminal branched portion 24 is a portion at which a P-side electrode 72 of the light emitting element 2 is disposed. The P-side terminal branched portion 24 is formed continuously with and perpendicularly to the second P-side electrode terminal 22 and extends toward the center of the second lead 20 in a planar view. The P-side terminal branched portion 24 is formed at a position that allows a portion thereof to overlap the heat dissipation terminal 13 of the first lead 10 in a planar view. The P-side terminal branched portion 24 allows the portion thereof to perpendicularly overlap the heat dissipation terminal 13 in a planar view. The heat dissipation terminal 13 of the first lead 10 has the recess portion 13a at the part that overlaps and faces the portion of the P-side terminal branched portion 24. Therefore, in the heat dissipation terminal 13 and the P-side terminal branched portion 24, the first lead 10 is spaced apart from the second lead 20 with the recess portion 13a interposed therebetween. The recess portion 13a between the heat dissipation terminal 13 and the P-side terminal branched portion 24 allows continuous filling with a part of the first molded body 61.

The heat dissipation terminal 13 is spaced apart from the N-side terminal branched portion 23 and the P-side terminal branched portion 24 to enable the N-side terminal branched portion 23 and the P-side terminal branched portion 24 for mounting the light emitting element 2 to be disposed on an upper surface of the heat dissipation terminal 13. Therefore, it is possible to form different electrode patterns between a front surface and a rear surface of the package 1. This makes it possible to use a mounting substrate having the same wiring pattern as the wiring pattern on the rear surface of the package 1 and to use the light emitting element 2 having a different number of terminals such as three terminals. Accordingly, the package 1 has high flexibility of designing.

The perpendicular disposition of the N-side terminal branched portion 23 and the P-side terminal branched portion 24 to the heat dissipation terminal 13 in a planar view facilitates the mounting of the light emitting element 2. In addition, such disposition facilitates manufacturing of the package 1.

The continuous filling with a part of the first molded body 61 between the heat dissipation terminal 13 and both the N-side terminal branched portion 23 and the P-side terminal branched portion 24 enables the heat dissipation terminal 13 to be more securely spaced apart from the N-side terminal branched portion 23 and the P-side terminal branched portion 24.

The holding portions 25 and 26 connect a plurality of second leads 20. The holding portion 25 is formed continuously with the second N-side electrode terminal 21, and the holding portion 26 is formed continuously with the second P-side electrode terminal 22. These holding portions 25 and 26 extend toward the exterior of the second lead 20 in a planar view. The holding portions 25 and 26 have front surfaces thereof half-etched and the second molded body 62 is provided in the half-etched portions. This makes the first lead 10 more strongly bonded to the second lead 20. The rear surfaces of the holding portions 25 and 26 are exposed from the second molded body 62.

Here, the holding portions 25 and 26 are described as portions other than the second N-side electrode terminal 21 and the second P-side electrode terminal 22, respectively. The holding portions 25 and 26, however, may be included in the second N-side electrode terminal 21 and the second P-side electrode terminal 22, respectively.

The holding portion 25 that is continuous with the second N-side electrode terminal 21 overlaps the holding portion 15 that is continuous with the first N-side electrode terminal 11 in a planar view, and these holding portions are bonded to each other by direct bonding. The holding portion 26 that is continuous with the second P-side electrode terminal 22 overlaps the holding portion 16 that is continuous with the first P-side electrode terminal 12 in a planar view, and these holding portions are bonded to each other by direct bonding.

A material for the first lead 10 and the second lead 20 is, for example, copper, a copper alloy, iron, or an iron alloy.

Plating may be performed on the first N-side electrode terminal 11, the first P-side electrode terminal 12, the heat dissipation terminal 13, the second N-side electrode terminal 21, the second P-side electrode terminal 22, and the holding portions 15, 16, 17, 25, and 26. That is, the first lead 10 and the second lead 20 may be plated. Particularly, the second lead 20 positioned on an upper surface side of the package 1 is preferably plated. The plating is capable of increasing the reflectivity of light from the light emitting element 2.

Examples of the plating include gold, silver, copper, platinum, and an alloy containing one of these metals. The plating with these metals is capable of increasing the reflectivity of light from the light emitting element 2.

The first molded body 61 is a member holding the first lead 10. The first molded body 61 is formed at the same thickness as the first lead 10. The second molded body 62 is a member holding the second lead 20. The second molded body 62 is formed at the same thickness as the second lead 20.

A material for the first molded body 61 and the second molded body 62 is, for example, a thermoplastic resin or a thermosetting resin. For the thermoplastic resin, it is possible to use, for example, a polyphthalamide resin, a liquid crystal polymer, polybutylene terephthalate (PBT), or unsaturated polyester. For the thermosetting resin, it is possible to use, for example, an epoxy resin, a modified epoxy resin, a silicone resin, or a modified silicone resin.

Light Emitting Device

Next, the light emitting device 100 is described.

The light emitting device 100 includes the package 1, the light emitting element 2, underfill 3, a frame body 4, and a covering member 5. The light emitting device 100 that includes the package 1 is capable of improving the bonding strength between the leads. The package 1 is as described above and is not described here.

Light Emitting Element

The light emitting element includes two N-side electrodes 71 and one P-side electrode 72 formed between the two N-side electrodes 71.

The light emitting element 2 has the two N-side electrodes 71 thereof connected to two N-side terminal branched portions 23 of the second lead 20, respectively, and has the one P-side electrode 72 thereof connected to the P-side terminal branched portion 24 of the second lead 20. This allows the light emitting element 2 to be mounted on the second lead 20 of the package 1. The light emitting element 2 used here is not particularly limited in terms of its shape or size. As a light emission color of the light emitting element 2, it is possible to select any wavelength according to the use application of the light emitting device. For example, as a blue (light with a wavelength of 430 to 490 nm) light emitting element 2, it is possible to use a GaN material or an InGaN material. As the InGaN material, it is possible to use $In_XAl_YGa_{1-X-Y}N$ ($0 \leq X \leq 1$, $0 \leq Y \leq 1$, and $X+Y \leq 1$).

Underfill

The underfill 3 is a member that absorbs stress caused by the difference in coefficient of thermal expansion between the light emitting element 2 and the package 1 and increases the heat releasing property.

The underfill 3 is formed in a gap between the package 1 and the light emitting element 2. A material for the underfill 3 is, for example, a thermosetting resin such as a silicone resin or an epoxy resin. Using, as the material for the underfill 3, a light reflective member such as a white resin is capable of reflecting light emitted from the light emitting element 2 toward the package 1 to increase the flux of light.

Frame Body

The frame body 4 is a member constituting a wall portion of the light emitting device 100. The frame body 4 may be formed on the package 1 to surround the light emitting element 2 or may be formed on the package 1 before the light emitting element 2 is mounted.

It is possible to form the frame body 4 by, for example, a thermoplastic resin, a thermosetting resin, a modified resin of these resins, or a hybrid resin containing at least one of these resins. Examples of the thermoplastic resin include a polyamide resin, a polyphthalamide resin, a polycarbonate resin, a polyphenylene sulfide resin, an ABS resin, an acrylic resin, a polybutylene terephthalate resin, a polyethylene terephthalate resin, a polycyclohexane terephthalate resin, and a liquid crystal polymer. Examples of the thermosetting resin include an epoxy resin, a silicone resin, a urea resin, a phenolic resin, a BT resin, a polyimide resin, and a polyurethane resin. These base materials may contain, for example, a coloring agent, a filler, reinforcement fiber, or a fluorescent substance that is known in this field. Particularly, as the coloring agent, a material excellent in reflectivity is preferable, and a white material such as titanium oxide or zinc oxide is preferable. Examples of the filler include silica and alumina. Examples of the reinforcement fiber include glass, calcium silicate, and potassium titanate.

Covering Member

The covering member 5 is a member covering the light emitting element 2.

The covering member 5 is formed in the frame body 4 on the package 1 to cover the light emitting element 2. The covering member 5 is provided to protect the light emitting element 2 from, for example, external force, dust, and moisture and to improve the heat resistance, the weather resistance, and the light stability of the light emitting element 2. A material for the covering member 5 is a thermosetting resin, for example, a transparent material such as a silicone resin, an epoxy resin, or a urea resin. It is possible to add to these materials a fluorescent material or a filler such as a high-light-reflectivity substance, for making the covering member have a prescribed function.

The covering member 5 having, for example, a fluorescent material mixed therein is capable of facilitating the color adjustment of the light emitting device 100. As the fluorescent material, it is possible to use a material that has a specific gravity larger than the specific gravity of the covering member 5, absorbs light from the light emitting element 2, and converts the wavelength of the light. The fluorescent material having a specific gravity larger than the specific gravity of the covering member 5 preferably settles on a package 1 side of the covering member. Specific examples of the fluorescent material include yellow fluorescent materials such as YAG ($Y_3Al_5O_{12}$:Ce) and silicate, red fluorescent materials such as CASN (CaAlSiN$_3$:Eu) and KSF ($K_2SiF_6$:Mn), and green fluorescent materials such as chlorosilicate and $BaSiO_4$:Eu$^{2+}$.

As the filler added to the covering member 5, it is possible to suitably use, for example, a high-light-reflectivity substance such as $SiO_2$, $TiO_2$, $Al_2O_3$, $ZrO_2$, or MgO. It is also possible to use, for example, an organic or inorganic coloring dye or coloring pigment for the purpose of cutting a wavelength other than a desired wavelength.

Method of Manufacturing Package

Next described is one exemplary method of manufacturing the package according to the first embodiment.

Figure 5A:
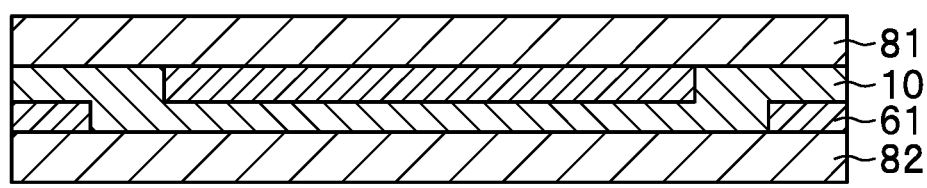
FIG. 5A is a schematic sectional view illustrating a step of forming the first molded body on the first lead in a method of manufacturing the package according to the first embodiment.
Figure 5B:
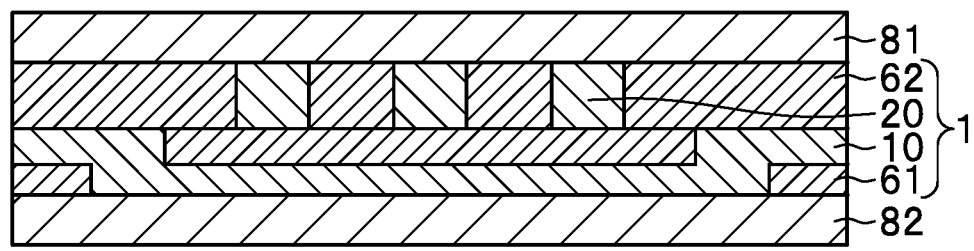
FIG. 5B is a schematic sectional view illustrating a step of forming the second molded body on the second lead in the method of manufacturing the package according to the first embodiment.

FIG. 5A is a schematic sectional view illustrating a step of forming the first molded body on the first lead in the method of manufacturing the package according to the first embodiment. FIG. 5B is a schematic sectional view illustrating a step of forming the second molded body on the second lead in the method of manufacturing the package according to the first embodiment. FIGS. 5A and 5B schematically illustrate one package of a plurality of packages manufactured simultaneously.

The method of manufacturing the package includes the steps of: preparing a first lead and a second lead, pressing, and forming a second molded body, and these steps are performed in this order. The materials, the disposition, and the like of the members are as described above in the package 1 and are not described here for convenience.

Preparing First Lead and Second Lead

The preparing a first lead and a second lead is preparing the first lead 10 provided with the first molded body 61 and the second lead 20.

In this step, first prepared are the first lead 10 having a prescribed wiring pattern and the second lead 20 having a prescribed wiring pattern. In the preparation, the prescribed positions are half-etched using a mask. In addition, plating is performed as necessary on surfaces of the first lead and the second lead that are not to be bonded.

Next, the first molded body 61 is formed on the first lead 10. For the formation of the first molded body 61, first, the first lead 10 is sandwiched between an upper mold 81 and a lower mold 82, and a resin is injected between the molds. Next, the resin injected between the molds is cured to form the first molded body 61. Thereafter, burr is removed to arrange the shape of the first molded body.

Pressing

The pressing is pressing the first lead 10 and the second lead 20 to bond them to each other by direct bonding at the prescribed portions. The pressing is also pressing the first lead 10 and the second lead 20 to space them apart from each other at the prescribed portions.

In this pressing, the first N-side electrode terminal 11 is bonded to the second N-side electrode terminal 21 and the first P-side electrode terminal 12 is bonded to the second P-side electrode terminal 22 by direct bonding, with the second lead 20 disposed on the first lead 10.

Also in this pressing, the pressing is performed to space the heat dissipation terminal 13 apart from the N-side terminal branched portion 23 and the P-side terminal branched portion 24, with the second lead 20 disposed on the first lead 10.

In this step, the first lead 10 and the second lead 20 are sandwiched between the upper mold 81 and the lower mold 82, with the second lead 20 disposed on the first lead 10. Then, the first lead and the second lead are pressed with the upper mold 81 and the lower mold 82 to bond the first N-side electrode terminal 11 to the second N-side electrode terminal 21 and bond the first P-side electrode terminal 12 to the second P-side electrode terminal 22 by direct bonding. Also, the first lead and the second lead are pressed with the upper mold 81 and the lower mold 82 to space the heat dissipation terminal 13 apart from the N-side terminal branched portion 23 and the P-side terminal branched portion 24.

The direct bonding is preferably diffusion bonding. The diffusion bonding is capable of integrating the bonded portions, without melting the base materials themselves. In addition, the diffusion bonding makes the bonded portions less likely to be peeled in processing after the bonding.

The conditions for the diffusion bonding is, for example, pressing in vacuum or inert gas at a temperature of 150° C. or higher and 190° C. or lower and a pressure of 90 MPa or more and 180 MPa or less.

Forming Second Molded Body

The forming a second molded body is forming the second molded body 62 holding the second lead 20.

In this step, the first lead 10 and the second lead 20 are sandwiched between the upper mold 81 and the lower mold 82, and a resin is injected between the molds. Next, the resin injected between the molds is cured to form the second molded body 62. Thereafter, burr is removed to arrange the shape of the first molded body.

Method of Manufacturing Light Emitting Device

Next described is one exemplary method of manufacturing the light emitting device 100 according to the first embodiment.

Figure 6A:
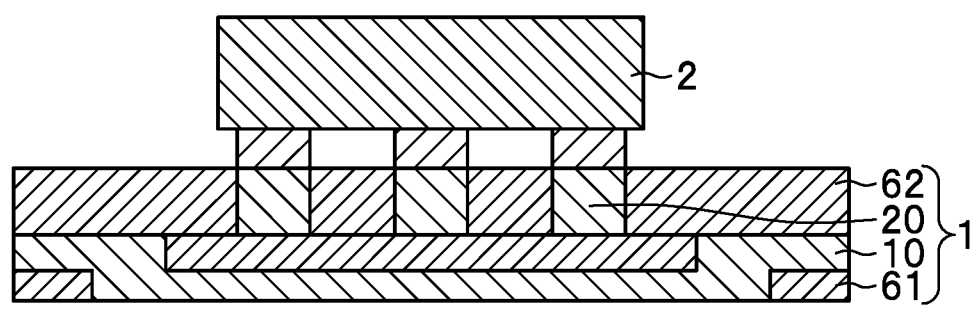
FIG. 6A is a schematic sectional view illustrating a step of mounting a light emitting element in a method of manufacturing the light emitting device according to the first embodiment.
Figure 6B:
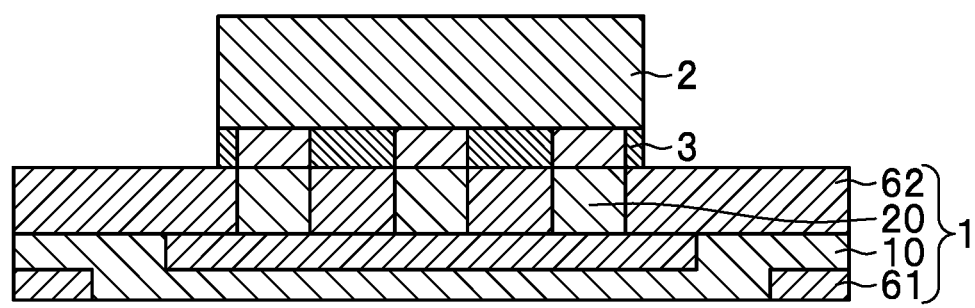
FIG. 6B is a schematic sectional view illustrating a step of forming underfill in the method of manufacturing the light emitting device according to the first embodiment.
Figure 6C:
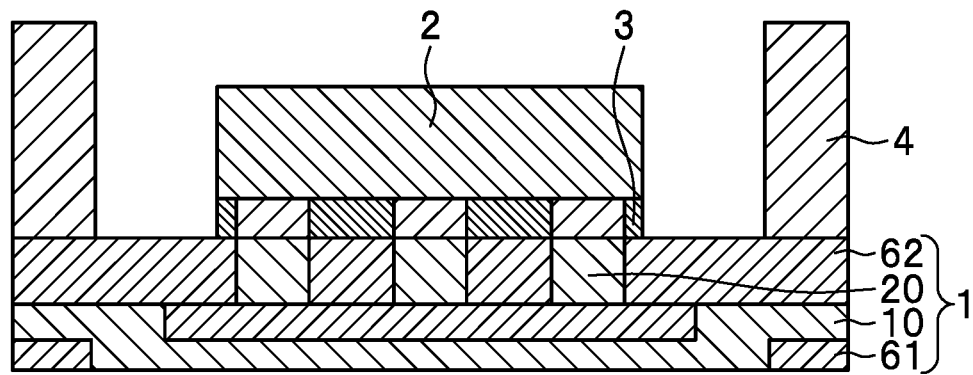
FIG. 6C is a schematic sectional view illustrating a step of forming a frame body in the method of manufacturing the light emitting device according to the first embodiment.
Figure 6D:
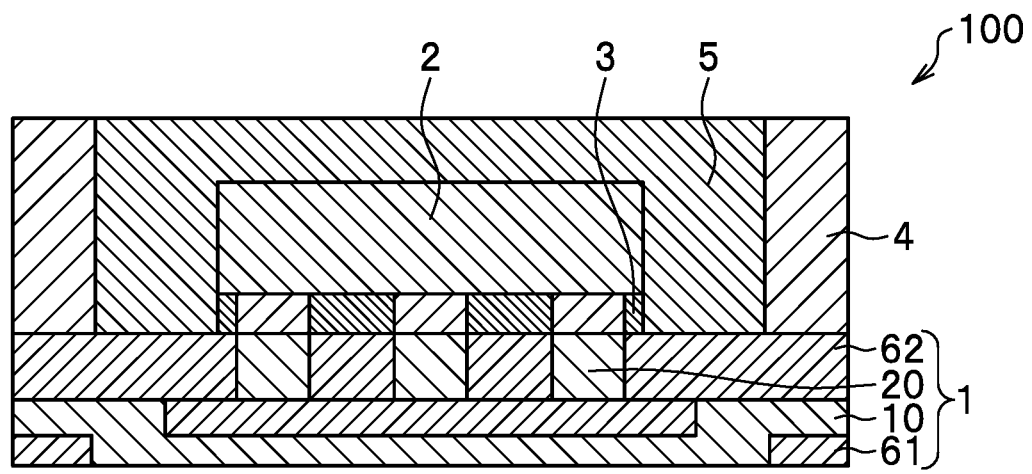
FIG. 6D is a schematic sectional view illustrating a step of forming a covering member in the method of manufacturing the light emitting device according to the first embodiment.

FIG. 6A is a schematic sectional view illustrating a step of mounting the light emitting element in the method of manufacturing the light emitting device according to the first embodiment. FIG. 6B is a schematic sectional view illustrating a step of forming the underfill in the method of manufacturing the light emitting device according to the first embodiment. FIG. 6C is a schematic sectional view illustrating a step of forming the frame body in the method of manufacturing the light emitting device according to the first embodiment. FIG. 6D is a schematic sectional view illustrating a step of forming the covering member in the method of manufacturing the light emitting device according to the first embodiment. FIGS. 6A to 6D schematically illustrate one light emitting device 100 of a plurality of light emitting devices 100 manufactured simultaneously.

The method of manufacturing the light emitting device includes the steps of: mounting a light emitting element, forming underfill, forming a frame body, forming a covering member, and division into pieces, and these steps are performed in this order. The materials, the disposition, and the like of the members are as described above in the light emitting device 100 and are not described here for convenience.

Mounting Light Emitting Element

The mounting a light emitting element is mounting the light emitting element 2 on the package 1 manufactured by the manufacturing method described above.

In this step, the N-side electrode 71 of the light emitting element 2 is bonded to the N-side terminal branched portion 23 of the second lead 20 and the P-side electrode 72 of the light emitting element 2 is bonded to the P-side terminal branched portion 24 of the second lead 20. The bonding may be performed using, for example, a solder paste.

Forming Underfill

The forming underfill is forming the underfill 3 in the gap between the package 1 and the light emitting element 2.

The formation of the underfill 3 is performed by first injecting a material for the underfill 3 between the package 1 and the light emitting element 2 to fill the gap generated between the package 1 and the light emitting element 2. Next, the injected material for the underfill 3 is thermally cured. This forms the underfill 3 between the package 1 and the light emitting element 2. The underfill 3 infiltrates between the package 1 and the light emitting element 2 to have a shape of widening toward the end. The formation of the underfill 3 may also be performed by disposing the material for the underfill 3 on the package 1 before mounting the light emitting element 2 and thermally curing the material after mounting the light emitting element 2.

Forming Frame Body

The forming a frame body is forming the frame body 4 to surround the light emitting element 2.

It is possible to form the frame body 4 by, for example, using a discharge device (dispenser) capable of moving (movable) vertically or horizontally with respect to the second lead 20 above the second lead 20 fixed.

Forming Covering Member

The forming a covering member is forming the covering member 5 in the frame body 4.

It is possible to form the covering member 5 by applying the covering member 5 in the frame body 4. It is also possible to form the covering member 5 by, for example, injection, compression, or extrusion.

Division into Pieces

The division into pieces is cutting and dividing an aggregate of light emitting devices 100 into pieces.

In this step, a plurality of packages 1 connected to each other by the holding portions 15, 16, and 17 of the first lead 10 and the holding portions 25 and 26 of the second lead 20 are divided into pieces by cutting the aggregate at the holding portions 15, 16, 17, 25, and 26.

It is possible to divide the aggregate into pieces by a conventionally known method such as a dicing method of performing cutting with a blade.

Second Embodiment

Figure 7A:
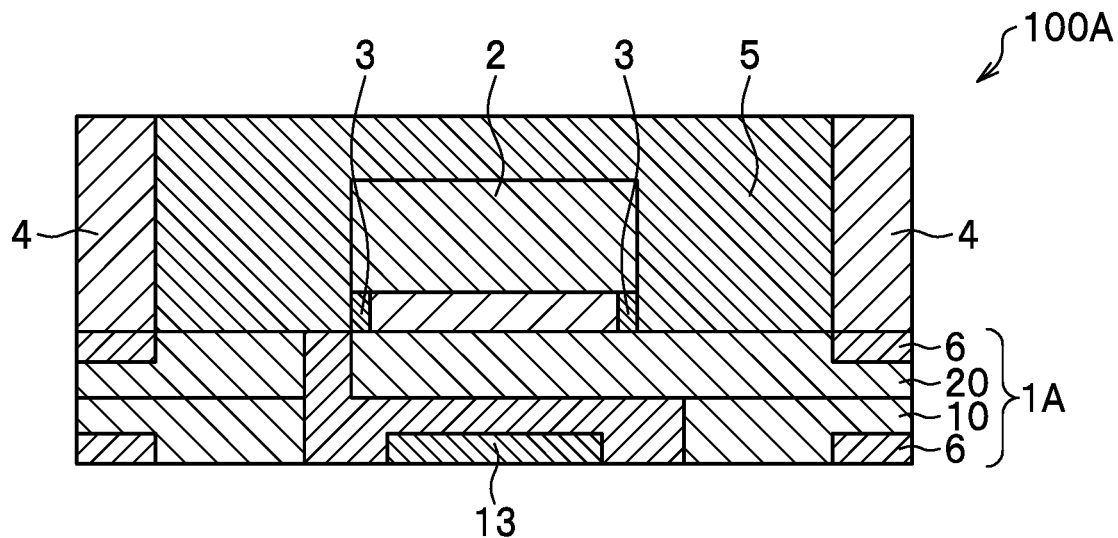
FIG. 7A is a schematic sectional view illustrating a configuration of a package and a light emitting device according to a second embodiment and corresponding to the schematic sectional view taken along the line IIA-IIA in FIG. 1B.
Figure 7B:
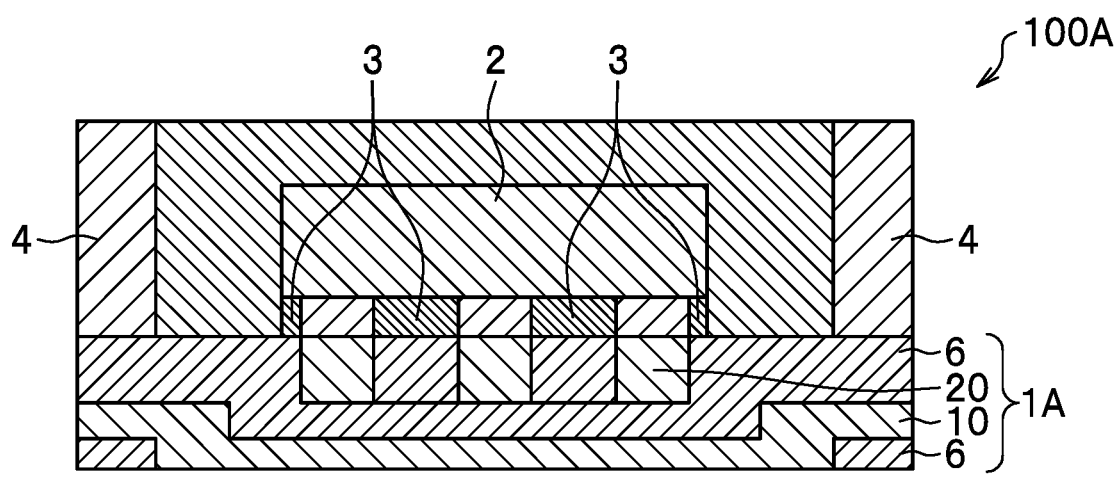
FIG. 7B is a schematic sectional view illustrating the configuration of the package and the light emitting device according to the second embodiment and corresponding to the schematic sectional view taken along the line IIB-IIB in FIG. 1B.

FIG. 7A is a schematic sectional view illustrating a configuration of a package and a light emitting device according to a second embodiment and corresponding to the schematic sectional view taken along the line IIA-IIA in FIG. 1B. FIG. 7B is a schematic sectional view illustrating the configuration of the package and the light emitting device according to the second embodiment and corresponding to the schematic sectional view taken along the line IIB-IIB in FIG. 1B.

Package and Light Emitting Device

A package 1A includes the first lead 10, the second lead 20, and a molded body 6.

A light emitting device 100A includes the package 1A, the light emitting element 2, the underfill 3, the frame body 4, and the covering member 5.

In the light emitting device 100A according to the second embodiment, the molded body 6 of the first lead 10 and the molded body 6 of the second lead 20 in the package 1A integrally form one molded body 6. The molded body 6 holds the first lead 10 and the second lead 20. The configurations other than the configuration described above are the same as the light emitting device 100 according to the first embodiment.

Method of Manufacturing Package

Next described is one exemplary method of manufacturing the package according to the second embodiment.

Figure 8A:
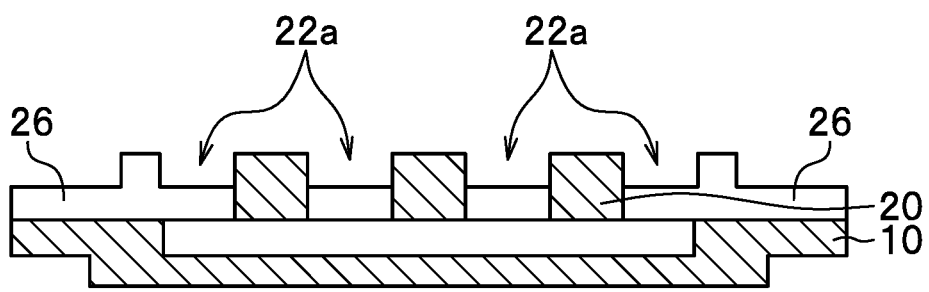
FIG. 8A is a schematic sectional view illustrating a state in which a second lead is disposed on a first lead in a method of manufacturing the package according to the second embodiment.
Figure 8B:
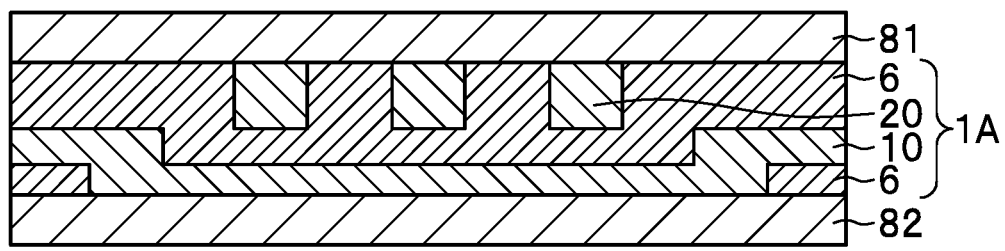
FIG. 8B is a schematic sectional view illustrating a step of forming a molded body on the first lead and the second lead in the method of manufacturing the package according to the second embodiment.

FIG. 8A is a schematic sectional view illustrating a state in which the second lead is disposed on the first lead in the method of manufacturing the package according to the second embodiment. FIG. 8B is a schematic sectional view illustrating a step of forming the molded body on the first lead and the second lead in the method of manufacturing the package according to the second embodiment. FIGS. 8A and 8B schematically illustrate one package of a plurality of packages manufactured simultaneously.

The method of manufacturing the package includes the steps of: preparing a first lead and a second lead, pressing, and forming a molded body, and these steps are performed in this order. The materials, the disposition, and the like of the members are as described above in the package 1 and are not described here for convenience.

Preparing First Lead and Second Lead

In the method of manufacturing the package according to the first embodiment, the first molded body 61 is formed on the first lead 10. In the method of manufacturing the package according to the second embodiment, however, the first molded body 61 is not formed on the first lead 10. The procedures other than the procedure described above are the same as the method of manufacturing the package according to the first embodiment.

Pressing

The pressing is the same as the pressing in the method of manufacturing the package according to the first embodiment.

Forming Molded Body

The forming a molded body is forming the molded body 6 holding the first lead 10 and the second lead 20.

In this step, the first lead 10 and the second lead 20 are sandwiched between the upper mold 81 and the lower mold 82, and a resin is injected between the molds. Next, the resin injected between the molds is cured to form the molded body 6. Thereafter, burr is removed to arrange the shape of the first molded body.

Method of Manufacturing Light Emitting Device

Next described is one exemplary method of manufacturing the light emitting device according to the second embodiment.

The method of manufacturing the light emitting device 100A is the same as the method of manufacturing the light emitting device 100 according to the first embodiment except for using the package 1A that has the molded body 6 of the first lead 10 and the molded body 6 of the second lead 20 integrally formed therein.

Other Embodiments

Figure 9A:
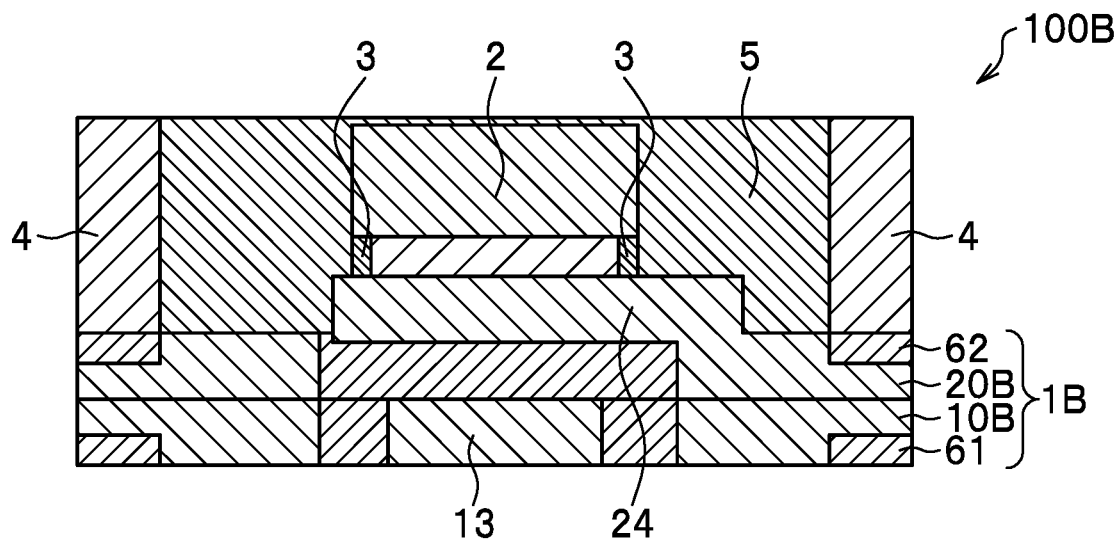
FIG. 9A is a schematic sectional view illustrating a configuration of a light emitting device according to another embodiment and corresponding to the schematic sectional view taken along the line IIA-IIA in FIG. 1B.
Figure 9B:
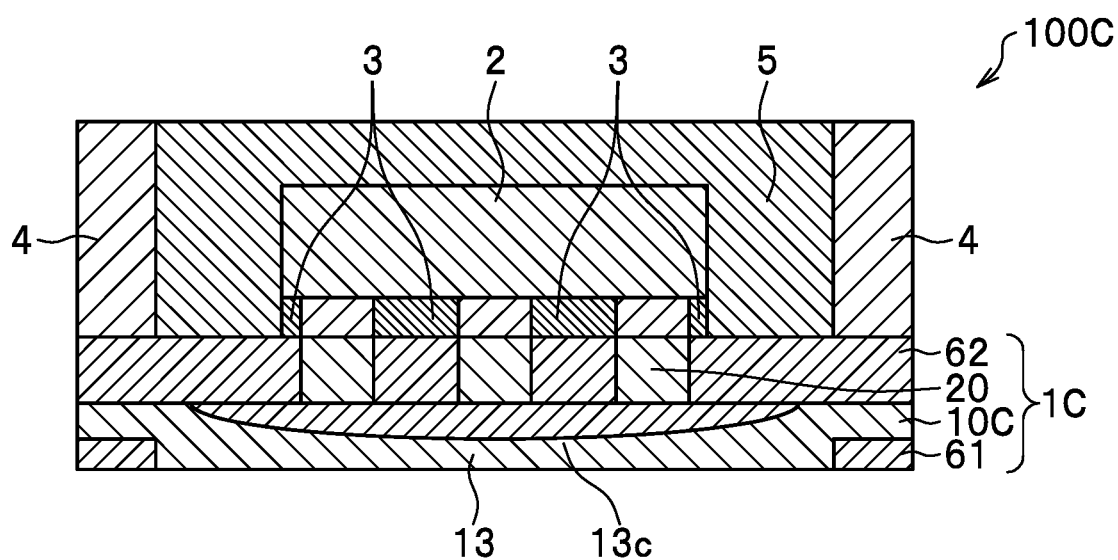
FIG. 9B is a schematic sectional view illustrating a configuration of a light emitting device according to another embodiment and corresponding to the schematic sectional view taken along the line IIB-IIB in FIG. 1B.
Figure 11A:
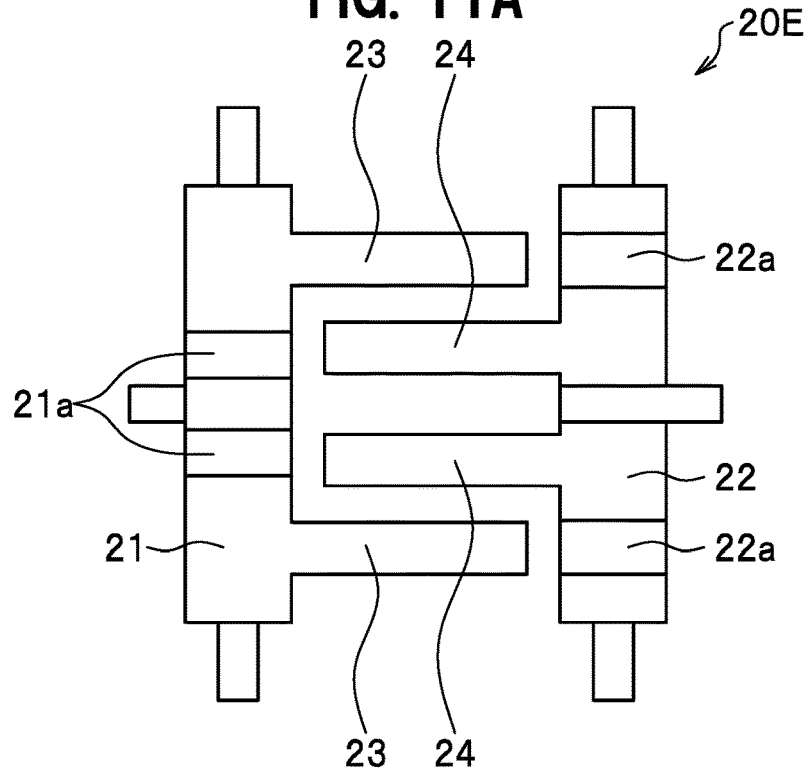
FIG. 11A is a schematic plan view illustrating a configuration of a second lead according to another embodiment.
Figure 11B:
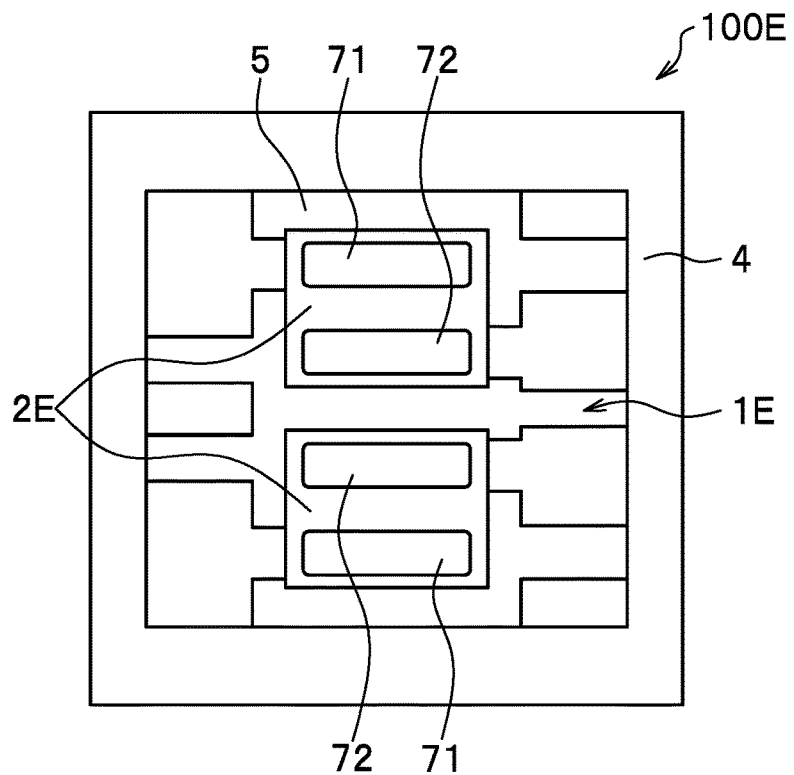
FIG. 11B is a schematic plan view illustrating a configuration of a light emitting device according to another embodiment.
Figure 12A:
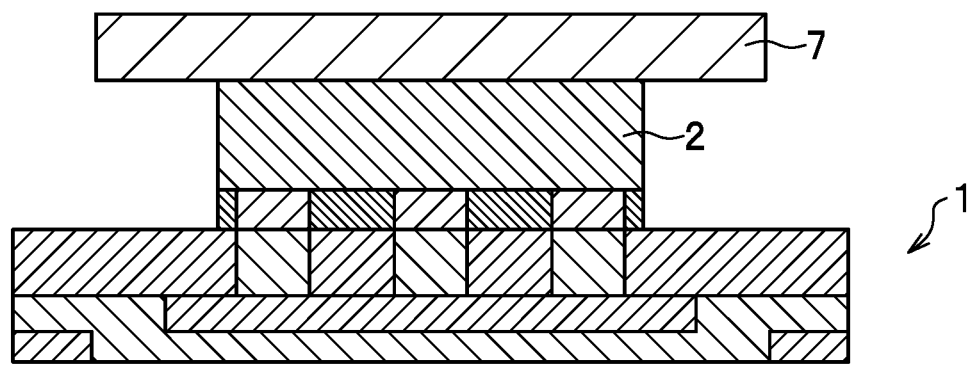
FIG. 12A is a schematic sectional view illustrating a step of forming a sheet member in a method of manufacturing a light emitting device according to another embodiment.
Figure 12B:
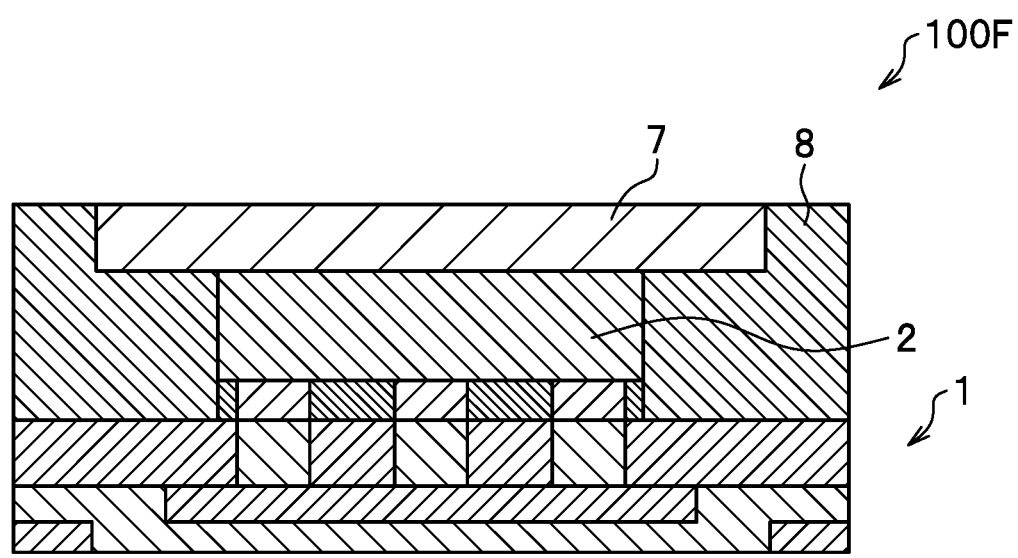
FIG. 12B is a schematic sectional view illustrating a step of forming a side wall member in a method of manufacturing a light emitting device according to another embodiment.

FIG. 9A is a schematic sectional view illustrating a configuration of a light emitting device according to another embodiment and corresponding to the schematic sectional view taken along the line IIA-IIA in FIG. 1B. FIG. 9B is a schematic sectional view illustrating a configuration of a light emitting device according to another embodiment and corresponding to the schematic sectional view taken along the line IIB-IIB in FIG. 1B. FIG. 10 is a schematic plan view illustrating a configuration of a light emitting device according to another embodiment. FIG. 11A is a schematic plan view illustrating a configuration of a second lead according to another embodiment. FIG. 11B is a schematic plan view illustrating a configuration of a light emitting device according to another embodiment. FIG. 12A is a schematic sectional view illustrating a step of forming a sheet member in a method of manufacturing a light emitting device according to another embodiment. FIG. 12B is a schematic sectional view illustrating a step of forming a side wall member in a method of manufacturing a light emitting device according to another embodiment.

In a light emitting device 100B shown in FIG. 9A, a recess portion is not provided on the heat dissipation terminal 13 of a first lead 10B in a package 1B. Further, the N-side terminal branched portion 23 and the P-side terminal branched portion 24 of a second lead 20B in the package 1B are bent along the thickness of the portions. With such a configuration, the heat dissipation terminal 13 may be spaced apart from the N-side terminal branched portion 23 and the P-side terminal branched portion 24.

In a light emitting device 100C shown in FIG. 9B, the heat dissipation terminal 13 of a first lead 10C in a package 1C is curved in a recess shape along the thickness of the heat dissipation terminal to form a curved portion 13c. With such a configuration, the heat dissipation terminal 13 may be spaced apart from the N-side terminal branched portion 23 and the P-side terminal branched portion 24.

Alternatively, the heat dissipation terminal 13 may be spaced apart from the N-side terminal branched portion 23 and the P-side terminal branched portion 24 by providing a recess portion on the N-side terminal branched portion 23 and the P-side terminal branched portion 24, curving the N-side terminal branched portion 23 and the P-side terminal branched portion 24 in a recess shape, or bending the heat dissipation terminal 13. Further, the heat dissipation terminal 13 may be spaced apart from the N-side terminal branched portion 23 and the P-side terminal branched portion 24 by providing a recess portion on all of the heat dissipation terminal 13, the N-side terminal branched portion 23, and the P-side terminal branched portion 24, curving all of the heat dissipation terminal 13, the N-side terminal branched portion 23, and the P-side terminal branched portion 24 in a recess shape, or bending all of the heat dissipation terminal 13, the N-side terminal branched portion 23, and the P-side terminal branched portion 24.

Like a light emitting device 100D shown in FIG. 10, the light emitting element may be a light emitting element 2D having a hexagonal shape in a planar view. Use of the light emitting element 2D having a hexagonal shape in a planar view decreases the distance from a side surface of the light emitting element 2D to the frame body 4 to improve the light extraction efficiency. The light emitting element may have a polygonal shape other than the hexagonal shape in a planar view.

As shown in FIG. 11A, the second lead may be a second lead 20E that includes two P-side terminal branched portions 24, with the two P-side terminal branched portions 24 disposed between the two N-side terminal branched portions 23. As shown in FIG. 11B, the light emitting device may be a light emitting device 100E obtained by preparing two light emitting elements 2E each having one N-side electrode 71 and one P-side electrode 72, and mounting the two light emitting elements 2E on the second lead 20E.

As shown in FIG. 12B, the light emitting device may be a light emitting device 100F including a sheet member 7 disposed on an upper surface of the light emitting element 2, and a side wall member 8 disposed on a side surface of the sheet member 7, a side surface of the light emitting element 2, and a side surface of the underfill 3.

As a material for the sheet member 7, it is possible to use the same material as the covering member 5. It is possible to add to the sheet member 7 a fluorescent material or a filler such as a high-light-reflectivity substance. As a material for the side wall member 8, it is possible to use the same material as the frame body 4.

It is possible to perform a method of manufacturing the light emitting device 100F, for example, as described below after the forming the underfill 3.

First, the sheet member 7 having a prescribed size is attached to the upper surface of the light emitting element 2 with, for example, an adhesive resin (forming a sheet member). Next, the side wall member 8 is applied to lateral side surfaces of, for example, the light emitting element 2 (forming a side wall member). Thereafter, an aggregate of light emitting devices 100F is cut and divided into pieces. The procedures other than the procedures described above are the same as the method of manufacturing the light emitting device 100 according to the first embodiment.

The heat dissipation terminal 13 is not necessarily disposed.

A part of the first molded body 61 or the molded body 6 is not necessarily provided between the heat dissipation terminal 13 and both the N-side terminal branched portion 23 and the P-side terminal branched portion 24.

As long as the heat dissipation terminal 13 is spaced apart from the N-side terminal branched portion 23 and the P-side terminal branched portion 24, the direct bonding is not necessarily performed between the first N-side electrode terminal 11 and the second N-side electrode terminal 21 and between the first P-side electrode terminal 12 and the second P-side electrode terminal 22.

With the heat dissipation terminal 13 spaced apart from the N-side terminal branched portion 23 and the P-side terminal branched portion 24, it is possible to form different electrode patterns between the front surface and the rear surface of the package as described above. Accordingly, the package 1 has high flexibility of designing.

Accordingly, in this case, the bonding may be performed with another member such as an adhesive agent between the first N-side electrode terminal 11 and the second N-side electrode terminal 21 and between the first P-side electrode terminal 12 and the second P-side electrode terminal 22.

In this case, the method of manufacturing a package includes pressing that is performed to bond the first lead 10 to the second lead 20 with another member such as an adhesive agent at the first N-side electrode terminal 11 and the second N-side electrode terminal 21 and at the first P-side electrode terminal 12 and the second P-side electrode terminal 22, with the second lead 20 disposed on the first lead 10.

As described above, the packages and the light emitting devices according to the present embodiments and the methods of manufacturing them have been specifically described by way of DESCRIPTION OF THE EMBODIMENTS. The subject matter of the present invention is, however, not to be limited to this description but is to be widely interpreted on the basis of the description of claims. Various changes, modifications, and the like based on this description are included in the subject matter of the present invention.

For example, the method of manufacturing a package and the method of manufacturing a light emitting device may include an additional step between steps, or before or after a step of the above-mentioned steps as long as the additional step does not adversely affect each of the steps. For example, the methods may include a foreign matter removal step of removing foreign matter mixed during manufacturing.

Obviously, numerous modifications and variations of the present invention are possible in light of the above teachings. It is therefore to be understood that within the scope of the appended claims, the invention may be practiced otherwise than as specifically described herein.

What is claimed is:

1. A package comprising:
   a first lead including a first electrode terminal;
   a second lead including a second electrode terminal and provided on the first lead in an overlapping direction such that the first electrode terminal of the first lead overlaps with the second electrode terminal of the second lead when viewed in the overlapping direction, the first electrode terminal and the second electrode terminal being electrically connected to each other without adding additional material;
   a first molded body holding the first lead; and
   a second molded body holding the second lead,
   wherein a part of the first molded body and a part of the second molded body are in contact with each other, and the second molded body has a same thickness the second lead.

2. The package according to claim 1, wherein plating is performed on the first electrode terminal and the second electrode terminal.

3. The package according to claim 2, wherein the plating is performed with gold, silver, copper, platinum, or an alloy containing one of these metals.

4. The package according to claim 1, wherein the first electrode terminal and the second electrode terminal are connected to each other via diffusion bonding.

5. The package according to claim 1, wherein the first lead includes an electrically independent terminal separate from the first electrode terminal, the second lead includes a terminal branched portion that is continuous with the second electrode terminal, and the electrically independent terminal is spaced apart from and is perpendicular to the terminal branched portion when viewed in the overlapping direction.

6. The package according to claim 5,
   wherein the first lead includes a first portion and a third portion spaced apart from the first portion,
   wherein the second lead is face-to-face bonded to the first lead and includes a second portion overlapping the first portion of the first lead and a fourth portion overlapping the third portion of the first lead in a planar view,
   wherein the first portion of the first lead is the first electrode terminal, the second portion of the second lead is the second electrode terminal, the third portion of the first lead is the electrically independent terminal from the first electrode terminal, and the fourth portion of the second lead is the terminal branched portion that is continuous with the second electrode terminal,
   wherein the first lead and the second lead are bonded to each other at portions exposed from the first molded body and the second molded body in the first portion and the second portion, and
   wherein the first lead is spaced apart from the second lead at the third portion overlapped by the fourth portion in the planar view.

7. The package according to claim 6, wherein a part of the first molded body continuously fills between the third portion and the fourth portion.

8. The package according to claim 6, wherein the first lead is spaced apart from the second lead at the third portion overlapped by the fourth portion in the planar view, with at least one of the third portion or the fourth portion having a recess portion.

9. The package according to claim 6, wherein the first lead is spaced apart from the second lead at the third portion overlapped by the fourth portion in the planar view, with at least one of the third portion or the fourth portion bent along thickness of the portion or curved in a recess shape along the thickness of the portion.

10. A package comprising:
    a first lead including a first electrode terminal:
    a second lead including a second electrode terminal and provided on the first lead in an overlapping direction such that the first electrode terminal of the first lead overlaps with the second electrode terminal of the second lead when viewed in the overlapping direction, the first electrode terminal and the second electrode terminal being electrically connected to each other without adding additional material;
    a first molded body holding the first lead; and
    a second molded body holding the second lead,
    wherein a part of the first molded body and a part of the second molded body are in contact with each other, and
    wherein the first electrode terminal has both surfaces thereof exposed from the first molded body, and the second electrode terminal has a recess portion on a surface opposite to a surface facing the first lead and has both surfaces thereof exposed from the second molded body except the recess portion.

11. A package comprising:
    a first lead including a first electrode terminal; and
    a second lead including a second electrode terminal and provided on the first lead in an overlapping direction such that the first electrode terminal of the first lead overlaps with the second electrode terminal of the second lead when viewed in the overlapping direction, the first electrode terminal and the second electrode terminal being electrically connected to each other without adding additional material;
    wherein the first lead includes an electrically independent terminal separate from the first electrode terminal, the second lead includes a terminal branched portion that is continuous with the second electrode terminal, the electrically independent terminal is spaced apart from the terminal branched portion, and the electrically independent terminal longitudinally extends in a first direction that is perpendicular to a second direction in which the terminal branched portion longitudinally extends when viewed in the overlapping direction.

12. The package according to claim 11, further comprising:
a first molded body holding the first lead; and
a second molded body holding the second lead.

13. The package according to claim 12, wherein the first electrode terminal has both surfaces thereof exposed from the first molded body, and the second electrode terminal has a recess portion on a surface opposite to a surface facing the first lead and has both surfaces thereof exposed from the second molded body except the recess portion.

14. The package according to claim 11, further comprising:
a molded body holding the first lead and the second lead.

15. The package according to claim 14,
wherein the first lead includes a first portion and a third portion spaced apart from the first portion,
wherein the second lead is face-to-face bonded to the first lead and includes a second portion overlapping the first portion of the first lead and a fourth portion overlapping the third portion of the first lead in a planar view,
wherein the first portion of the first lead is the first electrode terminal, the second portion of the second lead is the second electrode terminal, the third portion of the first lead is the electrically independent terminal from the first electrode terminal, and the fourth portion of the second lead is a terminal branched portion that is continuous with the second electrode terminal,
wherein the first lead and the second lead are bonded to each other at portions exposed from the molded body in the first portion and the second portion, and
wherein the first lead is spaced apart from the second lead at the third portion overlapped by the fourth portion in the planar view.

16. The package according to claim 15, wherein a part of the molded body fills between the third portion and the fourth portion.

17. The package according to claim 15, wherein the first lead is spaced apart from the second lead at the third portion overlapped by the fourth portion in the planar view, with at least one of the third portion or the fourth portion having a recess portion.

18. The package according to claim 11, wherein plating is performed on the first electrode terminal and the second electrode terminal.

19. The package according to claim 18, wherein the plating is performed with gold, silver, copper, platinum, or an alloy containing one of these metals.

20. The package according to claim 11, wherein the first electrode terminal and the second electrode terminal are connected to each other via diffusion bonding.

\* \* \* \* \*